US010217939B1

(12) United States Patent
Yu

(10) Patent No.: US 10,217,939 B1
(45) Date of Patent: Feb. 26, 2019

(54) SUBSTRATE AND EVAPORATION DEVICE USED FOR MANUFACTURING ORGANIC LIGHT EMITTING DISPLAY PANEL

(71) Applicant: WUHAN CHINA STAR OPTOELECTRONICS SEMICONDUCTOR DISPLAY TECHNOLOGY CO., LTD., Wuhan, Hubei (CN)

(72) Inventor: Wei Yu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 15/572,168

(22) PCT Filed: Sep. 6, 2017

(86) PCT No.: PCT/CN2017/100705
§ 371 (c)(1),
(2) Date: Nov. 7, 2017

(51) Int. Cl.
H01L 51/00 (2006.01)
H01L 51/56 (2006.01)
H01L 51/52 (2006.01)

(52) U.S. Cl.
CPC ........ H01L 51/001 (2013.01); H01L 51/0011 (2013.01); H01L 51/0096 (2013.01); H01L 51/5237 (2013.01); H01L 51/56 (2013.01); H01L 2251/5369 (2013.01)

(58) Field of Classification Search
CPC .............. H01L 51/001; H01L 51/0011; H01L 51/0096; H01L 51/5237; H01L 51/56; H01L 2251/5369
See application file for complete search history.

(56) References Cited

U.S. PATENT DOCUMENTS

| 2008/0198302 A1* | 8/2008 | Cho ...................... G02B 5/3058 349/96 |
| 2011/0018008 A1* | 1/2011 | Lee ...................... H01L 51/5237 257/88 |
| 2015/0270508 A1* | 9/2015 | Naito ........................ C03C 8/24 257/40 |
| 2015/0311473 A1* | 10/2015 | Kim .................... H01L 51/0011 257/40 |
| 2017/0054107 A1* | 2/2017 | Liu ...................... H01L 51/5253 |
| 2017/0155075 A1* | 6/2017 | Bi ......................... H01L 51/525 |

* cited by examiner

Primary Examiner — Allan R Wilson
(74) Attorney, Agent, or Firm — Mark M. Friedman

(57) ABSTRACT

The present disclosure provides a substrate and an evaporation device used for manufacturing an organic light emitting display panel. The substrate includes a base plate; a plurality of layer formation areas on the base plate, wherein the layer formation areas are where an organic light emitting layer is formed; a plurality of first spacers disposed on the base plate at a clearance region between the layer formation areas; and a plurality of second spacers disposed on the base plate at outer peripheries of the layer formation areas, wherein each of the second spacers includes a photoresist material and a plurality of magnetic polymer microspheres.

19 Claims, 2 Drawing Sheets

SUBSTRATE AND EVAPORATION DEVICE USED FOR MANUFACTURING ORGANIC LIGHT EMITTING DISPLAY PANEL

FIELD OF THE DISCLOSURE

The present disclosure relates to the field of display panels, and more particularly to a substrate and an evaporation device used for manufacturing an organic light emitting display panel.

BACKGROUND

Organic light emitting diode (OLED) displays possess many outstanding properties, including self-illumination, short response time, large viewing angles, and high color saturation, and thus are used widely in a variety of applications. OLED displays include an organic light emitting layer on the substrate, where the organic light emitting layer is sandwiched between a cathode electrode and an anode electrode. A voltage is applied to the cathode electrode and the anode electrode to cause the organic light emitting layer to illuminate.

To form the organic light emitting layer of OLED displays, an evaporation device is utilized to consecutively deposit a plurality of films on the substrate. OLED evaporation techniques heat an evaporation source that has been filled with an OLED material under a vacuum, so as to sublimate or gasify the material through a mask plate and make the material deposit on the substrate. The dashed lines in FIG. 1 show a flow direction of the OLED material. As shown in FIG. 1, for carrying out OLED evaporation, the evaporation source is located at lowest level, and the substrate 11 is disposed above the mask plate 21. The mask plate 21 includes a plurality of perforations 211 configured for the evaporation treatment. As shown in FIG. 2, a plurality of spacers 13 are disposed on the substrate 11 at outer peripheries of the layer formation areas 12. Generally, smaller gaps between the substrate 11 and the mask plate 21 is, means less influence caused by the shadowing effect. However, the spacers 13 have a certain height and the gap between the substrate 11 and the mask plate 21 cannot be reduced further. For substrate of high resolution, this makes the evaporation material diffuse to other color regions to some extent, causing color mixing.

Therefore, to solve the problems encountered by the prior art, there is a need to provide a substrate and an evaporation device used for manufacturing an organic light emitting display panel.

SUMMARY OF THE DISCLOSURE

One of the objectives of the present disclosure is to provide a substrate and an evaporation device used for manufacturing an organic light emitting display panel, in order to prevent the evaporation material from diffusing to other color regions and address the color mixing issue.

To solve the above mentioned problems, the present disclosure provides a substrate used for manufacturing an organic light emitting display panel, comprising:

a base plate;

a plurality of layer formation areas spaced from one another on the base plate, wherein the layer formation areas are where an organic light emitting layer is formed;

a plurality of first spacers disposed on the base plate at a clearance region between the layer formation areas; and a plurality of second spacers disposed on the base plate at outer peripheries of the layer formation areas, wherein each of the second spacers includes a photoresist material and a plurality of magnetic polymer microspheres, the magnetic polymer microspheres have a particulate diameter ranging from 30 nm to 100 nm, and the first spacers and the second spacers are of the same material.

In accordance with the substrate used for manufacturing an organic light emitting display panel according to the present disclosure, the magnetic polymer microspheres are magnetic polyacrolein-based microspheres.

In accordance with the substrate used for manufacturing an organic light emitting display panel according to the present disclosure, the first spacers and the second spacers are formed by a same process.

In accordance with the substrate used for manufacturing an organic light emitting display panel according to the present disclosure, a height of the second spacers and a height of the first spacers are identical.

In accordance with the substrate used for manufacturing an organic light emitting display panel according to the present disclosure, a total number of the second spacers and a total number of the layer formation areas are identical.

The present disclosure further provides a substrate used for manufacturing an organic light emitting display panel, comprising:

a base plate;

a plurality of layer formation areas spaced from one another on the base plate, wherein the layer formation areas are where an organic light emitting layer is formed;

a plurality of first spacers disposed on the base plate at a clearance region between the layer formation areas; and a plurality of second spacers disposed on the base plate at outer peripheries of the layer formation areas, wherein each of the second spacers includes a photoresist material and a plurality of magnetic polymer microsphere.

In accordance with the substrate used for manufacturing an organic light emitting display panel according to the present disclosure, the magnetic polymer microspheres are magnetic polyacrolein-based microspheres.

In accordance with the substrate used for manufacturing an organic light emitting display panel according to the present disclosure, the first spacers and the second spacers are of the same material.

In accordance with the substrate used for manufacturing an organic light emitting display panel according to the present disclosure, the first spacers and the second spacers are formed by a same process.

In accordance with the substrate used for manufacturing an organic light emitting display panel according to the present disclosure, a height of the second spacers and a height of the first spacers are identical.

In accordance with the substrate used for manufacturing an organic light emitting display panel according to the present disclosure, the magnetic polymer microspheres have a particulate diameter ranging from 30 nm to 100 nm.

In accordance with the substrate used for manufacturing an organic light emitting display panel according to the present disclosure, a total number of the second spacers and a total number of the layer formation areas are identical.

Additionally, the present disclosure provides an evaporation device used for performing an evaporation treatment for a substrate disposed above a mask plate, the evaporation device comprising:

an evaporation source for providing an organic light emitting material;

the mask plate having a plurality of perforations configured for the evaporation treatment; and the substrate, the substrate comprising:
  a base plate;
  a plurality of layer formation areas spaced from one another on the base plate, wherein the layer formation areas are where an organic light emitting layer is formed;
  a plurality of first spacers disposed between the base plate and the mask plate at a clearance region between the layer formation areas; and
  a plurality of second spacers disposed between the base plate and the mask plate at outer peripheries of the layer formation areas, wherein each of the second spacers includes a photoresist material and a plurality of magnetic polymer microspheres.

In accordance with the evaporation device of the present disclosure, the first spacers and the second spacers are of the same material.

In accordance with the evaporation device of the present disclosure, a height of the second spacers and a height of the first spacers are identical.

In accordance with the evaporation device of the present disclosure, the magnetic polymer microspheres are magnetic polyacrolein-based microspheres.

In accordance with the evaporation device of the present disclosure, the first spacers and the second spacers are formed by a same process.

In accordance with the evaporation device of the present disclosure, the magnetic polymer microspheres have a particulate diameter ranging from 30 nm to 100 nm.

In accordance with the evaporation device of the present disclosure, a total number of the second spacers and a total number of the layer formation areas are identical.

According to the present disclosure, another spacers are disposed at outer peripheries of the layer formation areas on the substrate of the evaporation device used for manufacturing an organic light emitting display panel, and the spacers include magnetic polymer microspheres, therefore the spacers are bonded to the mask plate tightly and the evaporation material is blocked from diffusing to other color regions to address the color mixing issue.

DETAILED DESCRIPTION

Figure 1:
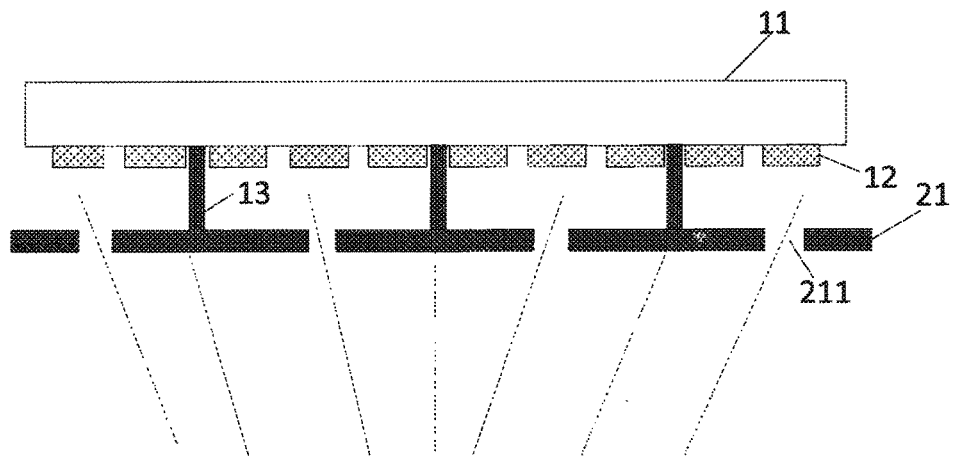
FIG. 1 is a cross-sectional side view of a substrate used for manufacturing an organic light emitting display panel according to the prior art.
Figure 2:
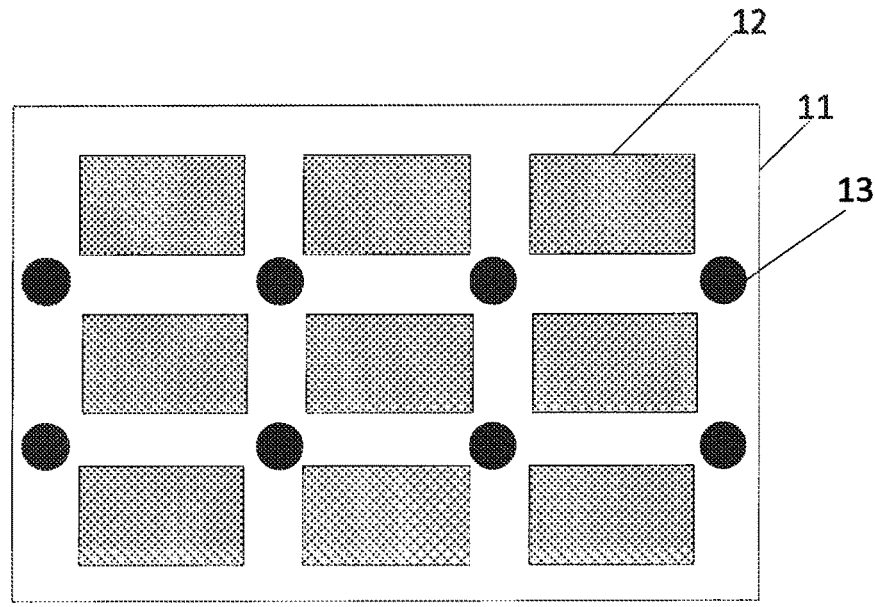
FIG. 2 is a top view of a substrate used for manufacturing an organic light emitting display panel according to the prior art.

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

Figure 3:
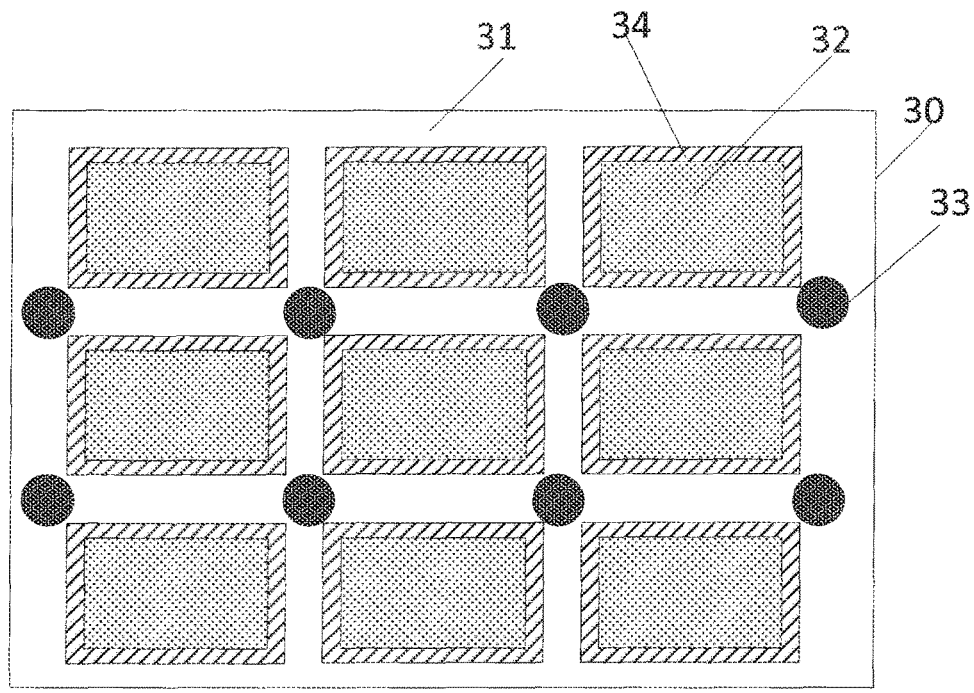
FIG. 3 is a top view of a substrate used for manufacturing an organic light emitting display panel according to the present disclosure.
Figure 4:
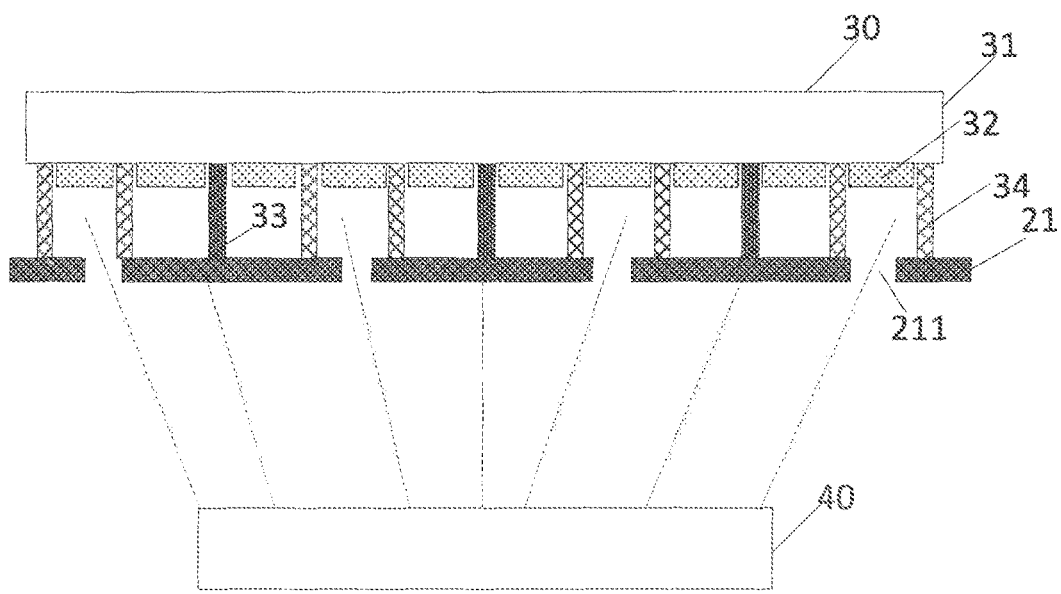
FIG. 4 is a cross-sectional side view of a substrate used for manufacturing an organic light emitting display panel according to the present disclosure.

Please refer to FIGS. 3 and 4. FIG. 3 is a top view of a substrate used for manufacturing an organic light emitting display panel according to the present disclosure.

As shown in FIGS. 3 and 4, the substrate used for manufacturing an organic light emitting display panel according to the present disclosure includes a base plate 31, a plurality of layer formation areas 32, a plurality of first spacers 33, and a plurality of second spacers 34. The substrate 30 is used for forming of an organic light emitting layer of the organic light emitting display panel. The base plate 31 is made of conductive glass, i.e., ITO glass.

The layer formation areas 32 are spaced from one another on the base plate 31. The layer formation areas 32 are where an organic light emitting layer is formed. Specifically, the organic light emitting layer is formed by utilizing an evaporation source 40 to perform an evaporation treatment for the substrate 30.

The first spacers 33 are disposed on the base plate 31 at a clearance region between the layer formation areas 32. The first spacers 33 are spaced from the layer formation areas 32.

The second spacers 34 are disposed on the base plate 31 at outer peripheries of the layer formation areas 32. That is, an outer periphery of each of the layer formation areas 32 includes one of the second spacers 34. A total number of the second spacers 34 and a total number of the layer formation areas 32 are identical.

Each of the second spacers 34 includes a photoresist material and a plurality of magnetic polymer microspheres. Each of the second spacers 34 have a structure that the magnetic polymer microspheres are dispersed in the photoresist material. The magnetic polymer microspheres have a particulate diameter ranging from 30 nm to 100 nm. Since the particulate diameter of the magnetic polymer microspheres falls within this range, the magnetic polymer microspheres are highly magnetic. This increases adhesion ability of the magnetic polymer microspheres to the mask plate. In one embodiment, the magnetic polymer microspheres are magnetic polyacrolein-based microspheres.

Since the magnetic property presented by the magnetic polymer microspheres attracts the mask plate 21, the mask plate 21 are bonded to the second spacers 34 tightly. In this way, the organic light emitting material that is evaporated and deposited onto the substrate 30 is blocked by the second spacers 34 which surround the layer formation areas, preventing shadowing from occurring and addressing color mixing.

In one embodiment, the second spacers 34 and the first spacers 33 are of different material. The first spacers 33 are made of a photoresist material.

In another embodiment, the first spacers 33 and the second spacers 34 are of the same material. In other words, each of the first spacers 33 also includes a photoresist material and a plurality of magnetic polymer microspheres. Since the magnetic property presented by the magnetic polymer microspheres attracts the mask plate 21, the mask plate 21 are bonded to the first spacers 33 tightly, reducing the gap between the substrate and the mask plate and further preventing shadowing from occurring.

In one embodiment, the first spacers 33 and the second spacers 34 are formed by a same process. For example, the first spacers 33 and the second spacers 34 are formed simultaneously by a lithography process that includes a coating step and a developing step.

In one embodiment, a height of the second spacers 34 and a height of the first spacers 33 are identical for simplifying the manufacturing process and lowering the manufacturing cost.

According to the present disclosure, another spacers are disposed at outer peripheries of the layer formation areas on the substrate used for manufacturing an organic light emitting display panel, and the spacers include magnetic polymer microspheres, therefore the spacers are bonded to the mask plate tightly and the evaporation material is blocked from diffusing to other color regions to address the color mixing issue.

The present disclosure further provides an evaporation device used for performing an evaporation treatment for a substrate disposed above a mask plate. As shown in FIGS. 3 and 4, the evaporation device includes a mask plate 21, a substrate 30, and an evaporation source 40. The evaporation source 40 is disposed below the mask plate 21 for providing an organic light emitting material in order to form an organic light emitting layer on the substrate 30. In carrying out the evaporation treatment, the evaporation device has to be disposed within an air-tight space that is vacuum-sealed. The evaporation device can further include a heating device (not shown) for removing impurities on surface of the evaporation source 40.

The mask plate 21 includes a plurality of perforations 211 configured for the evaporation treatment. The mask plate 21 can be made of metal. The organic light emitting layer is formed by providing the light emitting material through the perforations 211 on the mask plate 21. The dashed lines in FIG. 4 show the flow direction of the light emitting material.

The substrate 30 is used for forming of an organic light emitting layer of the organic light emitting display panel. The substrate 30 includes a base plate 31, a plurality of layer formation areas 32, a plurality of first spacers 33, and a plurality of second spacers 34. The base plate 31 is made of conductive glass, i.e., ITO glass.

The layer formation areas 32 are spaced from one another on the base plate 31. The layer formation areas 32 are where an organic light emitting layer is formed. Specifically, the organic light emitting layer is formed by utilizing an evaporation source 40 to perform an evaporation treatment for the substrate 30.

The first spacers 33 are disposed on the base plate 31 at a clearance region between the layer formation areas 32. The first spacers 33 are disposed between the base plate 31 and the mask plate 21. The first spacers 33 are spaced from the layer formation areas 32.

The second spacers 34 are disposed on the base plate 31 and between the base plate 31 and the mask plate 21. The second spacers 34 are disposed at outer peripheries of the layer formation areas 32. That is, an outer periphery of each of the layer formation areas 32 includes one of the second spacers 34. A total number of the second spacers 34 and a total number of the layer formation areas 32 are identical.

Each of the second spacers 34 includes a photoresist material and a plurality of magnetic polymer microspheres. Each of the second spacers 34 have a structure that the magnetic polymer microspheres are dispersed in the photoresist material. The magnetic polymer microspheres have a particulate diameter ranging from 30 nm to 100 nm. Since the particulate diameter of the magnetic polymer microspheres falls within this range, the magnetic polymer microspheres are highly magnetic. This increases adhesion ability of the magnetic polymer microspheres to the mask plate. In one embodiment, the magnetic polymer microspheres are magnetic polyacrolein-based microspheres.

Since the magnetic property presented by the magnetic polymer microspheres attracts the mask plate 21, the mask plate 21 is bonded to the second spacers 34 tightly. In this way, the organic light emitting material that is evaporated and deposited onto the substrate 30 is blocked by the second spacers 34 which surround the layer formation areas, preventing the shadowing effect from occurring and addressing the color mixing issue.

In one embodiment, the second spacers 34 and the first spacers 33 are of different material. The first spacers 33 are made of a photoresist material.

In another embodiment, the first spacers 33 and the second spacers 34 are of the same material. In other words, each of the first spacers 33 also includes a photoresist material and a plurality of magnetic polymer microspheres. Since the magnetic property presented by the magnetic polymer microspheres attracts the mask plate 21, the mask plate 21 is bonded to the first spacers 33 tightly, reducing the gap between the substrate and the mask plate and further preventing the shadowing effect from occurring.

In one embodiment, the first spacers 33 and the second spacers 34 are formed by a same process. For example, the first spacers 33 and the second spacers 34 are formed simultaneously by a lithography process that includes a coating step and a developing step.

In one embodiment, a height of the second spacers 34 and a height of the first spacers 33 are identical for simplifying the manufacturing process and lowering the manufacturing cost.

According to the present disclosure, another spacers are disposed at outer peripheries of the layer formation areas on the substrate of the evaporation device used for manufacturing an organic light emitting display panel, and the spacers include magnetic polymer microspheres, therefore the spacers are bonded to the mask plate tightly and the evaporation material is blocked from diffusing to other color regions to address the color mixing issue.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A substrate used for manufacturing an organic light emitting display panel, comprising:
a base plate;
a plurality of layer formation areas spaced from one another on the base plate, wherein an organic light emitting layer is formed on the layer formation areas;
a plurality of first spacers disposed on the base plate at a clearance region between the layer formation areas; and
a plurality of second spacers disposed on the base plate at outer peripheries of the layer formation areas, wherein each of the second spacers includes a photoresist material and a plurality of magnetic polymer microspheres, the magnetic polymer microspheres have a particulate diameter ranging from 30 nm to 100 nm, and the first spacers and the second spacers are of a same material.

2. The substrate used for manufacturing an organic light emitting display panel according to claim 1, wherein the magnetic polymer microspheres are magnetic polyacrolein-based microspheres.

3. The substrate used for manufacturing an organic light emitting display panel according to claim 1, wherein the first spacers and the second spacers are formed by a same process.

4. The substrate used for manufacturing an organic light emitting display panel according to claim 1, wherein a height of the second spacers and a height of the first spacers are identical.

5. The substrate used for manufacturing an organic light emitting display panel according to claim 1, wherein a total number of the second spacers and a total number of the layer formation areas are identical.

6. A substrate used for manufacturing an organic light emitting display panel, comprising:
 a base plate;
 a plurality of layer formation areas spaced from one another on the base plate, wherein the layer formation areas are where an organic light emitting layer is formed;
 a plurality of first spacers disposed on the base plate at a clearance region between the layer formation areas; and
 a plurality of second spacers disposed on the base plate at outer peripheries of the layer formation areas, wherein each of the second spacers includes a photoresist material and a plurality of magnetic polymer microsphere.

7. The substrate used for manufacturing an organic light emitting display panel according to claim 6, wherein the magnetic polymer microspheres are magnetic polyacrolein-based microspheres.

8. The substrate used for manufacturing an organic light emitting display panel according to claim 6, wherein the first spacers and the second spacers are of the same material.

9. The substrate used for manufacturing an organic light emitting display panel according to claim 6, wherein the first spacers and the second spacers are formed by a same process.

10. The substrate used for manufacturing an organic light emitting display panel according to claim 6, wherein a height of the second spacers and a height of the first spacers are identical.

11. The substrate used for manufacturing an organic light emitting display panel according to claim 6, wherein the magnetic polymer microspheres have a particulate diameter ranging from 30 nm to 100 nm.

12. The substrate used for manufacturing an organic light emitting display panel according to claim 6, wherein a total number of the second spacers and a total number of the layer formation areas are identical.

13. An evaporation device used for performing an evaporation treatment for a substrate disposed above a mask plate, the evaporation device comprising:
 an evaporation source for providing an organic light emitting material;
 the mask plate having a plurality of perforations configured for the evaporation treatment; and
 the substrate, the substrate comprising:
  a base plate;
  a plurality of layer formation areas spaced from one another on the base plate, wherein the layer formation areas are where an organic light emitting layer is formed;
  a plurality of first spacers disposed between the base plate and the mask plate at a clearance region between the layer formation areas; and
  a plurality of second spacers disposed between the base plate and the mask plate at outer peripheries of the layer formation areas, wherein each of the second spacers includes a photoresist material and a plurality of magnetic polymer microspheres.

14. The evaporation device according to claim 13, wherein the first spacers and the second spacers are of the same material.

15. The evaporation device according to claim 13, wherein a height of the second spacers and a height of the first spacers are identical.

16. The evaporation device according to claim 13, wherein the magnetic polymer microspheres are magnetic polyacrolein-based microspheres.

17. The evaporation device according to claim 13, wherein the first spacers and the second spacers are formed by a same process.

18. The evaporation device according to claim 13, wherein the magnetic polymer microspheres have a particulate diameter ranging from 30 nm to 100 nm.

19. The evaporation device according to claim 13, wherein a total number of the second spacers and a total number of the layer formation areas are identical.

* * * * *